United States Patent
Riekkinen et al.

(10) Patent No.: US 8,950,057 B2
(45) Date of Patent: Feb. 10, 2015

(54) PARALLEL-PLATE STRUCTURE FABRICATION METHOD

(75) Inventors: Tommi Riekkinen, Lohja (FI); Tomi Mattila, Espoo (FI)

(73) Assignee: Valtion Teknillinen Tutkimuskeskus (FI)

( * ) Notice: Subject to any disclaimer, the term of this patent is extended or adjusted under 35 U.S.C. 154(b) by 855 days.

(21) Appl. No.: 12/440,743

(22) PCT Filed: Sep. 14, 2007

(86) PCT No.: PCT/FI2007/000232
§ 371 (c)(1),
(2), (4) Date: Mar. 11, 2009

(87) PCT Pub. No.: WO2008/034940
PCT Pub. Date: Mar. 27, 2008

(65) Prior Publication Data
US 2010/0067167 A1    Mar. 18, 2010

(30) Foreign Application Priority Data
Sep. 18, 2006  (FI) .................................... 20060832

(51) Int. Cl.
H01S 4/00       (2006.01)
H01G 7/00       (2006.01)
H01G 7/06       (2006.01)
H01L 49/02      (2006.01)
H01L 41/29      (2013.01)
H01L 41/187     (2006.01)
H01L 41/312     (2013.01)

(52) U.S. Cl.
CPC .................. *H01G 7/06* (2013.01); *H01L 28/55* (2013.01); *H01L 41/29* (2013.01); *H01L 41/1871* (2013.01); *H01L 41/312* (2013.01)
USPC .......... 29/592.1; 29/25.42; 29/25.35; 361/312

(58) Field of Classification Search
USPC ................... 29/25.35–25.42, 594, 592.1, 846; 310/320, 366; 333/193
See application file for complete search history.

(56) References Cited

U.S. PATENT DOCUMENTS

| | | | | |
|---|---|---|---|---|
| 5,446,306 | A * | 8/1995 | Stokes et al. .................. | 257/416 |
| 5,742,471 | A * | 4/1998 | Barbee et al. ................ | 361/312 |
| 6,387,748 | B1 * | 5/2002 | Agarwal ....................... | 438/239 |
| 6,441,539 | B1 * | 8/2002 | Kitamura et al. ............ | 310/346 |
| 6,507,983 | B1 * | 1/2003 | Ruby et al. ................... | 29/25.35 |
| 6,780,792 | B2 * | 8/2004 | Agarwal ....................... | 438/785 |
| 7,140,084 | B2 * | 11/2006 | Yamada et al. ............. | 29/25.35 |
| 7,167,355 | B2 * | 1/2007 | Chen ............................. | 361/508 |
| 7,258,742 | B2 * | 8/2007 | Higuchi et al. ............... | 117/86 |
| 7,424,772 | B2 * | 9/2008 | Larson, III ................... | 29/25.35 |
| 7,490,390 | B2 * | 2/2009 | Kawakubo et al. .......... | 29/25.35 |

(Continued)

FOREIGN PATENT DOCUMENTS

WO        2004044965   A        5/2004

*Primary Examiner* — Minh Trinh
(74) *Attorney, Agent, or Firm* — Thorpe North & Western LLP

(57) ABSTRACT

A fabrication method for parallel-plate structures and a parallel-plate structure arrangement, wherein the structures have a middle layer, grown on a substrate and disposed between top and bottom electrode layers, wherein the middle layer and the top and bottom electrode layers are deposited on a bottom substrate, and wherein the middle layer is grown first and the top and bottom electrodes are essentially deposited afterwards.

17 Claims, 7 Drawing Sheets

(56) References Cited

U.S. PATENT DOCUMENTS

| | | | |
|---|---|---|---|
| 8,528,175 B2 * | 9/2013 | Antonov et al. | 29/25.42 |
| 2003/0189225 A1 | 10/2003 | Agarwal | |
| 2006/0185139 A1 * | 8/2006 | Larson et al. | 29/25.35 |
| 2006/0198599 A1 | 9/2006 | Higuchi et al. | |

* cited by examiner

PARALLEL-PLATE STRUCTURE FABRICATION METHOD

FIELD OF THE INVENTION

The present invention relates to a parallel-plate structure fabrication method. Especially the present invention relates to a parallel-plate structure fabrication method for ferroelectric and piezoelectric thin film structure and to fabrication method for integrated structures based on said structures and e.g. thick metal inductors.

The present invention also relates to parallel-plate structures, and especially to e.g. ferroelectric and piezoelectric thin film structures and integrated structures based on the said structures and e.g. thick metal inductors.

BACKGROUND OF THE INVENTION

Perovskite metal-oxides, such as $Ba_xSr_{1-x}TiO_3$ (hereinafter called "BST"), show exceptional material properties including (i) switchable permanent polarization (ferroelectric phase), (ii) piezoelectricity (ferroelectric phase), (iii) field-dependent (tunable) polarization (paraelectric phase), (iv) low losses at high frequencies (paraelectric phase). Tunability and low losses, typically obtained in the paraelectric phase, make these materials of special interest for high-frequency applications. An example of a basic device realizable using these materials is a tunable capacitor (varactor).

For optimal tunability, parallel-plate device geometry is highly desirable: here the perovskite metal-oxide is sandwiched between two (top and bottom) metallic electrodes. Using planar device geometries based on metal electrodes deposited only on top of the perovskite metal-oxide, it is difficult to obtain sufficient tunability.

In the prior art parallel-plate capacitor fabrication process, the layers are deposited successively on a substrate, ie. the metallic bottom electrode is first deposited on the substrate, then the BST layer is deposited on the metallic bottom electrode and finally the metallic top electrode is deposited on the BST.

High processing temperatures are required for proper crystallization of perovskite oxides (e.g. for BST, $T_{min} \sim 650°$ C.). The high temperature and the presence of oxygen make the parallel-plate device processing problematic. The metallic bottom electrode is heavily attacked during BST growth. Typical problems encountered in the bottom electrode are (i) electrode destruction via oxidation, (ii) grain growth resulting in poor BST quality. On the other hand, the electrode material should be well conducting to prevent the critical losses at high frequencies. Of typical metals, Cu, Ag, Al, and Au are well conducting but either get easily oxidized and/or are unstable substrates for BST growth due to their low melting point. A typical state-of-the-art choice for the bottom electrode is Pt, which, however, (i) is a significantly worse conductor than the metals above, (ii) will easily exhibit grain growth if thick layers are employed to reduce conductor losses. Furthermore, Pt is permeable with respect to oxygen, and reactive with respect to other metals—both effects complicating the fabrication of multilayered electrode structures. The refractory metals (Mo,W) are more stable against grain growth and they are intermediate conductors but get easily oxidized. Protective layers (e.g. diffusion barriers) can in principle be employed to protect the bottom electrode from oxidation, but it is difficult to obtain a well-protecting layer with minimal parasitic effects (e.g. non-tunable capacitance).

SUMMARY OF THE INVENTION

It is therefore an object of the present invention to eliminate the disadvantages of the prior art parallel-plate structure fabrication methods and to provide an improved method for fabrication of parallel-plate structures.

It is further an object of the present invention to eliminate the disadvantages of the prior art parallel-plate structures and to provide an improved parallel-plate structure arrangement.

The present invention provides a solution to the disadvantages of the prior art with an improved fabrication method which is based on layer transfer fabrication techniques and utilizes an auxiliary substrate on which the BST or a corresponding middle layer is first deposited.

In the invented processing method BST or another suitable material is grown first and the top and bottom electrodes are essentially deposited second utilizing layer transfer. Characteristic features of the present invention are in detail presented in the enclosed claims.

Key advantages of the present invention are:
BST or corresponding middle layer growth can be done in optimal conditions to obtain high BST or corresponding middle layer quality. E.g. high growth temperatures and the highly oxidizing growth atmosphere can be used without the risk of electrode destruction.
a wide variety of metals, including e.g. Cu, can be used for electrodes as metal oxidation and/or high-temperature grain growth are no more an issue
all key layers (bottom metal electrode, middle layer, like BST, top metal electrode) can be patterned. In particular, contacts to bottom electrode can be easily made
by employing a structure where two capacitors are connected in series and are inversely biased, the even-order nonlinearities will be removed or strongly attenuated,
it is possible to implement integrated structures including tunable capacitors and additional integrated components such as (i) several inductors or further capacitors, (ii) resistors (e.g. for biasing), (iii) non-tunable capacitors,
the process can be integrated as part of IPD (Integrated Passive Device) fabrication process. Tunable, low-loss capacitors combined with high-Q inductors (thick Cu, low-loss glass substrate), integrated resistors, etc. allow the creation of attractive applications such as excellent phase noise VCO:s, tunable impedance matching networks or filters, etc.

BRIEF DESCRIPTION OF THE DRAWINGS

The foregoing, and additional objects, features and advantages of the present invention will be more clearly understood from the following detailed description of preferred embodiments of the present invention, taken in conjunction with accompanying drawings, in which.

DESCRIPTION OF THE PREFERRED EMBODIMENTS

FIGS. 1a to 1d present process schematics for thin film capacitor fabrication via layer transfer method. The middle ferroelectric or piezoelectric (e.g. BST) layer 102 is sandwiched between two (top and bottom) metallic electrodes 101, 103 (see e.g. FIG. 1d).

Figure 1A:
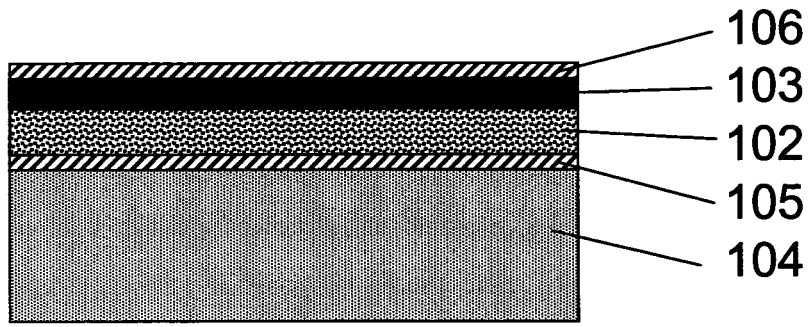
FIGS. 1a to 1d present process schematics for ferroelectric or piezoelectric (e.g. BST) thin film capacitor fabrication via layer transfer method.
Figure 1B:
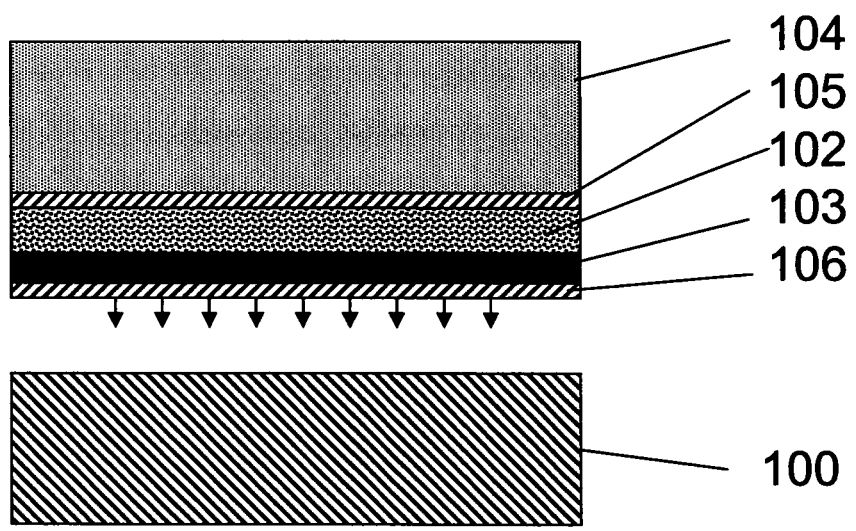
Figure 1C:
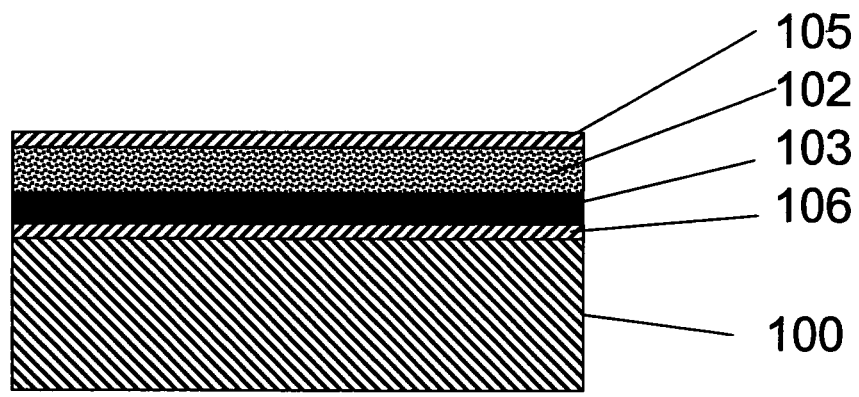
Figure 1D:
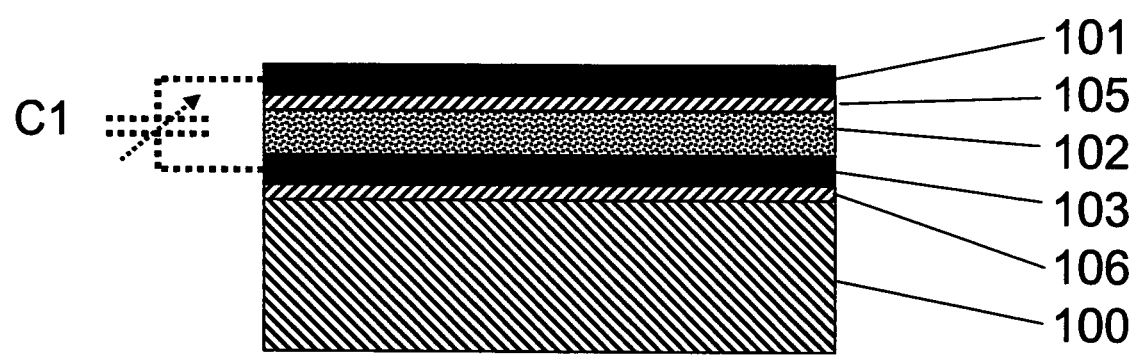

The method is in detail illustrated in the following with reference to the following process steps: (1-2) BST growth and bottom electrode deposition on the first substrate (FIG. 1a), (3) layer transfer from the first substrate to the second substrate (FIG. 1b), (4) first substrate removal (FIGS. 1c), and (5) top electrode deposition and (FIG. 1d).

In the invented processing method, as outlined in FIGS. 1, the metal-oxide layer 102 is grown first and the top and bottom electrodes 101, 103 are essentially deposited second utilizing layer transfer.

(1) BST is grown on a first (auxiliary) substrate 104 (e.g. Si). The substrate will be later removed and therefore is to be suitably selected for this purpose. For optimal BST growth, a suitable seed layer 105 may be grown on substrate. Seed layer is optional and can be e.g. pure $SiO_2$ or thin Pt on $SiO_2$. As both bottom and top metal electrodes are in essence deposited after BST growth, the BST growth conditions can be chosen for optimal BST growth: e.g. optimally high temperatures can be used without the deterioration of metallic electrode.

(2) Bottom electrode 103 deposition after BST growth, on top of BST. The electrode metal can be rather freely selected, in particular it can be e.g. Cu, Al, Ag or Au. Since metal deposition can be done at low temperatures (e.g. T<200° C.), and oxygen is highly bound to already grown BST, the deposited metal is not heavily attacked by oxygen or temperature. The bottom metal electrode 103 can be patterned. Next, a buffer layer 106 is grown (e.g. thick $SiO_2$) which is planarized. The role of the buffer layer is to allow wafer bonding to a second (bottom) substrate 100 (e.g. glass). Alternatively, the buffer layer can be e.g. a polymer film (e.g. BCB, polyimide) deposited e.g. using spin coating.

(3) BST layer 102 transfer to a second substrate 100. The prepared BST wafer is bonded with the second substrate (e.g. glass).

(4) The first substrate removal after wafer bonding. Possible methods include, for example, : (i) chemical wet-etching of Si (HF+HNO3+CH3COOH), (ii) chemical-mechanical thinning (grinding, polishing) followed by plasma etching (e.g ICP, DRIE,). Key aspect in removal of the first substrate is etch selectivity: (a) e.g. seed layer of thin Pt can act as the etch stop after first substrate is removed, (b) the second substrate and BST are to be selective to the first substrate removal or are to be protected. The seed layer 105, if applied, can be optionally also removed before top electrode deposition.

(5) Top electrode 101 deposition. Metal can be freely selected as for the bottom electrode. As a result, the capacitor C1 having bottom and top electrodes 103, 101 and a middle layer 102 has been fabricated.

Figure 2:
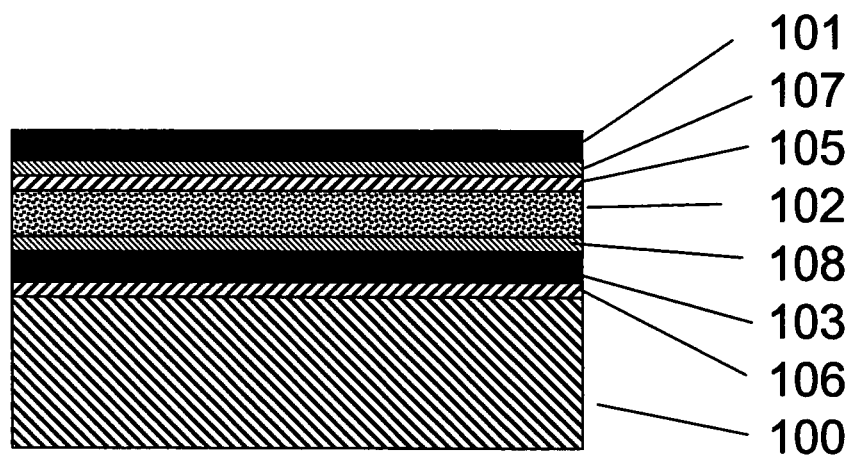
FIG. 2 presents a preferred embodiment of including layers acting to improve electrode material adhesion and/or to served as diffusion barriers

Additional layers serving as adhesion layers and/or diffusion barriers 107, 108 can be employed (e.g. TiW) between the BST and the top and the bottom electrodes as shown in FIG. 2.).

Patterning of the layers to obtain desired capacitor structures. As shown as an example in FIG. 3a, the top electrode layer 111, the seed layer 115 for BST growth, the BST layer 112, and the bottom electrode layer 113 embedded in a top planarization layer 110 are patterned to create a two-capacitors-in-series structure accessible via the top metal contacts. In particular, the BST layer can be patterned before wafer bonding to control strain when transferring the BST thin film from the first substrate to the second substrate—i.e. to avoid BST cracking.

Figure 3A:
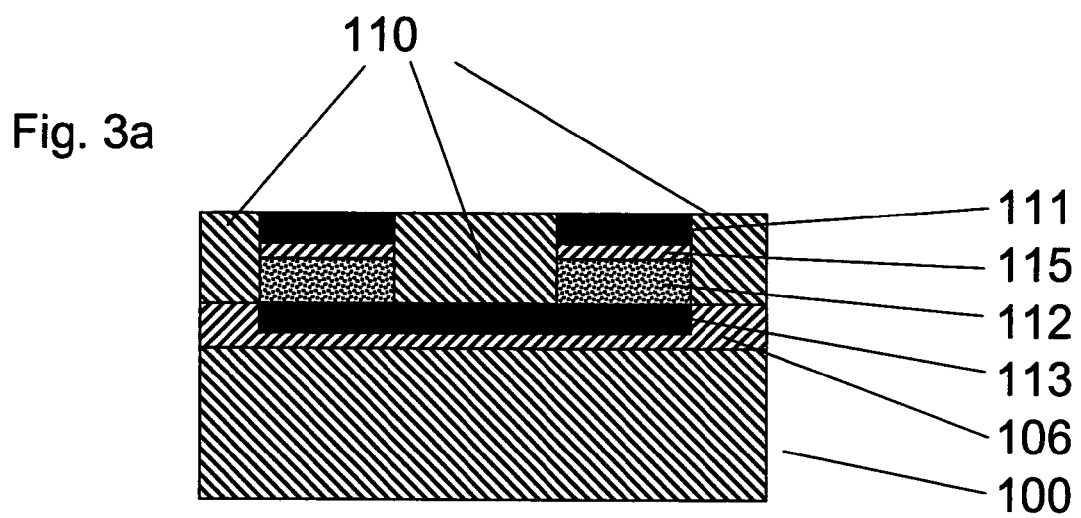
FIGS. 3a and 3b present preferred embodiments, where the processed layers, in particular the middle (e.g. BST) layer and the electrode layers, are patterned to create desired capacitor structures.
Figure 3B:
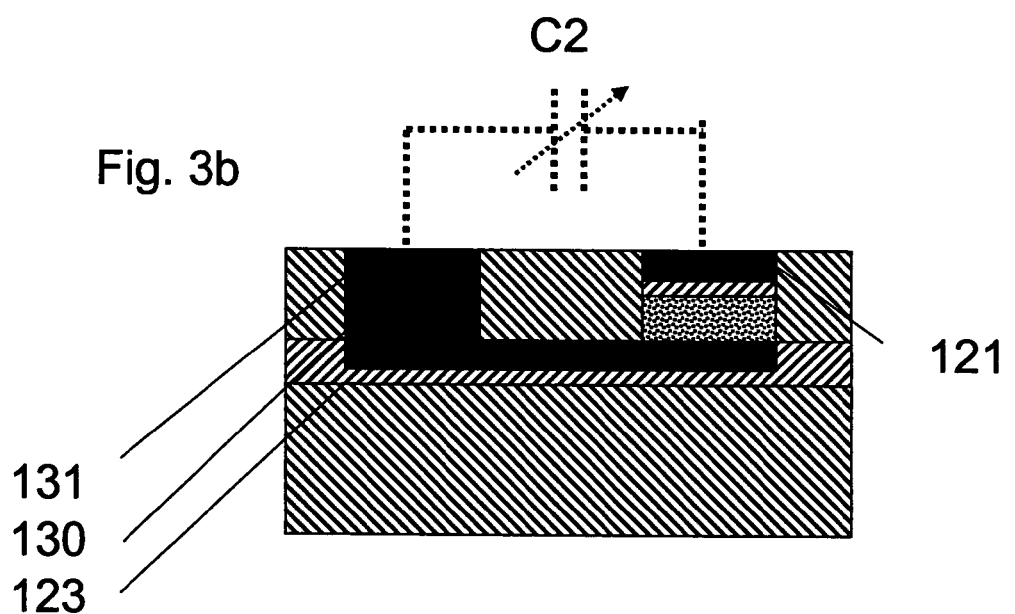

The process sequence easily allows also processing to create an ohmic contact creation to the bottom electrode 123 from the top metal 121 as shown in FIG. 3b presenting the top electrode including a contact 130 to the bottom electrode. The capacitor C2 is formed between the top and bottom layers wherein further the bottom electrode is connected to another area 131 on the top layer in order to get an external contact.

Figure 4A:
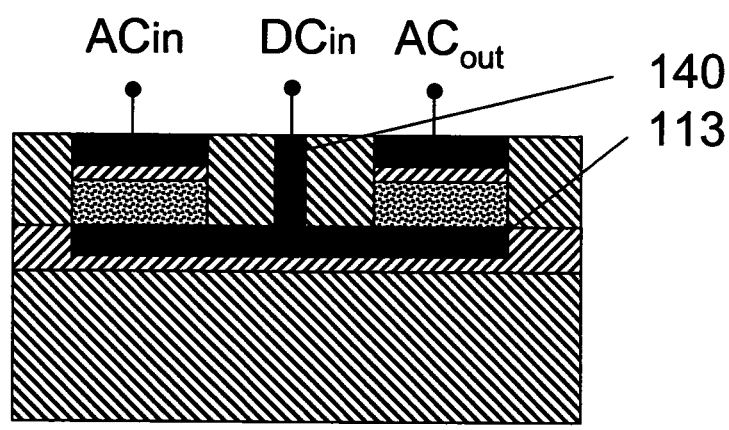
FIGS. 4a and 4b present a preferred embodiment where two ferroelectric capacitors are placed in series and a DC contact is created to the (bottom) electrode contacting the two capacitors.
Figure 4B:
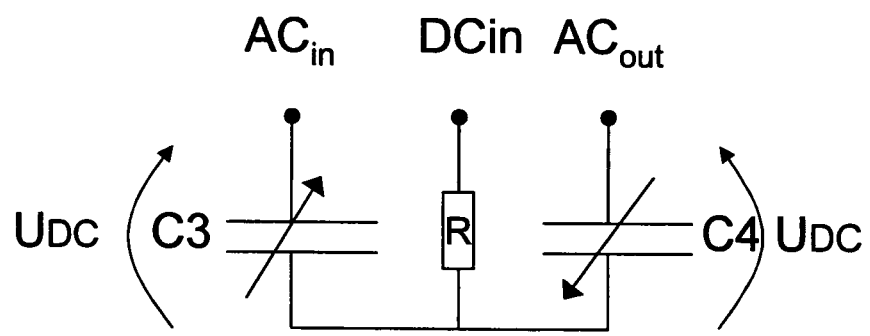

FIG. 4a shows a schematic structure where a DC contact 140 is realized to the bottom electrode 113 (see FIG. 3a). The bottom electrode connects the two ferroelectric (tunable) capacitors in C3, C4 series. By connecting a tuning DC voltage DCin (typically via a high impedance route as illustrated by the resistor R in FIG. 4b) to the bottom electrode, the two capacitors will be inversely biased, that is, the bias voltage UDC will be parallel to AC signal in one of the capacitors C3 while being antiparallel in the other capacitor C4. The key advantages of the preferred embodiment shown in FIGS. 4a and 4b are: (i) the even order nonlinearities (e.g. even harmonics) will be removed or strongly attenuated due to inverse biasing, (ii) a DC-block is realized to prevent the DC-voltage reaching the AC-contacts ACin, ACout. If desired, several copies of the structure described by FIGS. 4a and 4b can be connected in series to gain additional advantages.

Figure 5A:
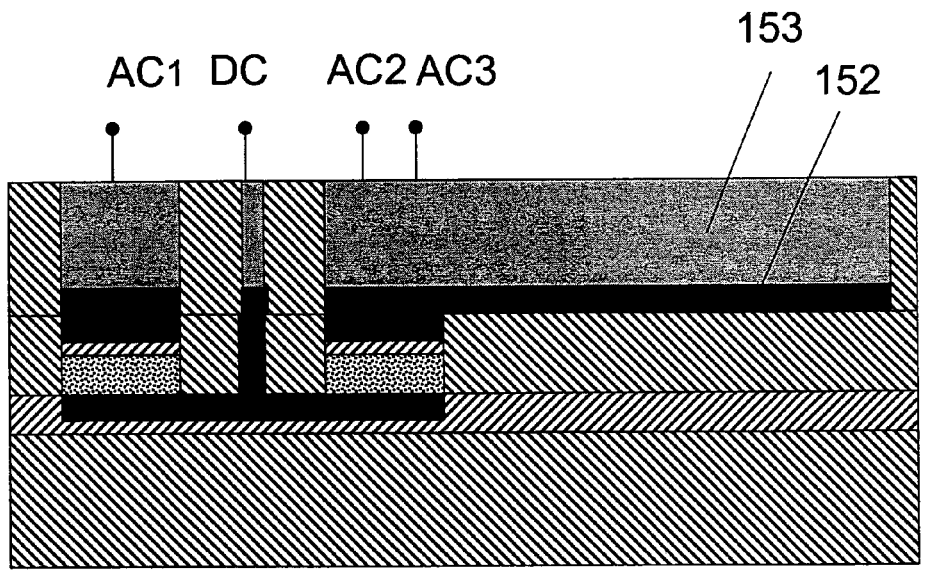
FIGS. 5a to 5c present a side view and top view as well as coupling schema of a preferred embodiment where electrodeposition is employed to realize low-loss inductor structures via the thick top electrode layer, thereby allowing integrated, high-performance tunable LC-structures.
Figure 5B:
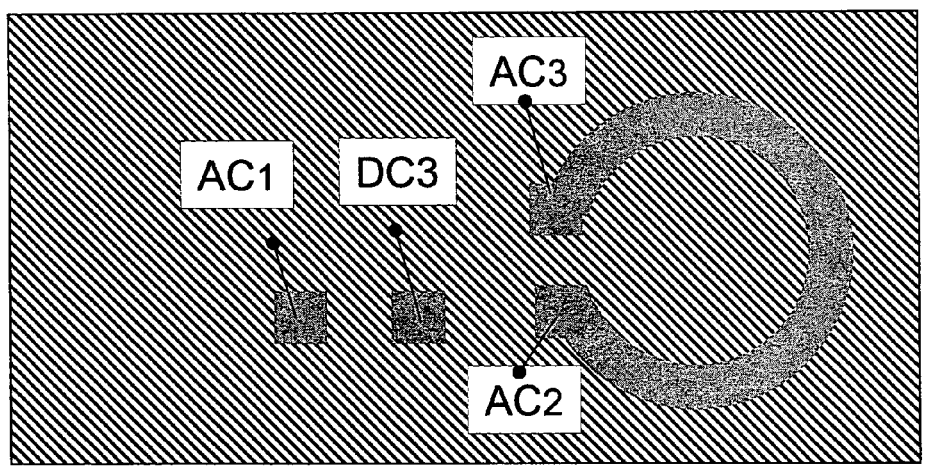
Figure 5C:
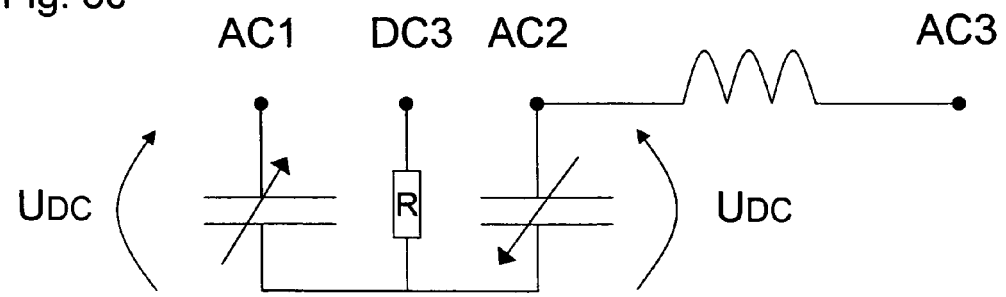

Thick metal deposition methods, electrodeposition growth in particular, can be applied to obtain thick top metal conductors. As shown in FIG. 5a, the top electrode is on the contrary to FIG. 1d essentially thicker than the bottom electrode and consists of two layers 152, 153, the first layer 152 being a thin layer and the second layer 153 being a galvanic grown thicker layer 153 (typical thickness ratio 1:10 between the layer thicknesses). As further shown in FIGS. 5a to 5c, the thick top metal layer is utilized to create a low-loss (high-Q) inductor, which is connected with the dual inversely biased tunable capacitor structure described in FIGS. 4a and 4b. The resulting integrated structure has four electrical connections (AC1, AC2, AC3, DC3) which can be used to access a tunable, high-Q LC-circuit (parallel or series configuration). Such a tunable, high-Q LC-circuit can be used e.g. to realize a high performance voltage controlled oscillator (VCO) where the high tank Q-value, due to low-loss inductor and low-loss capacitors, results in excellent phase noise performance. Another key feature is the small second order nonlinearity due to inversely biased capacitors-configuration, which critically reduces the up-mixing of 1/f-noise.

Figure 6A:
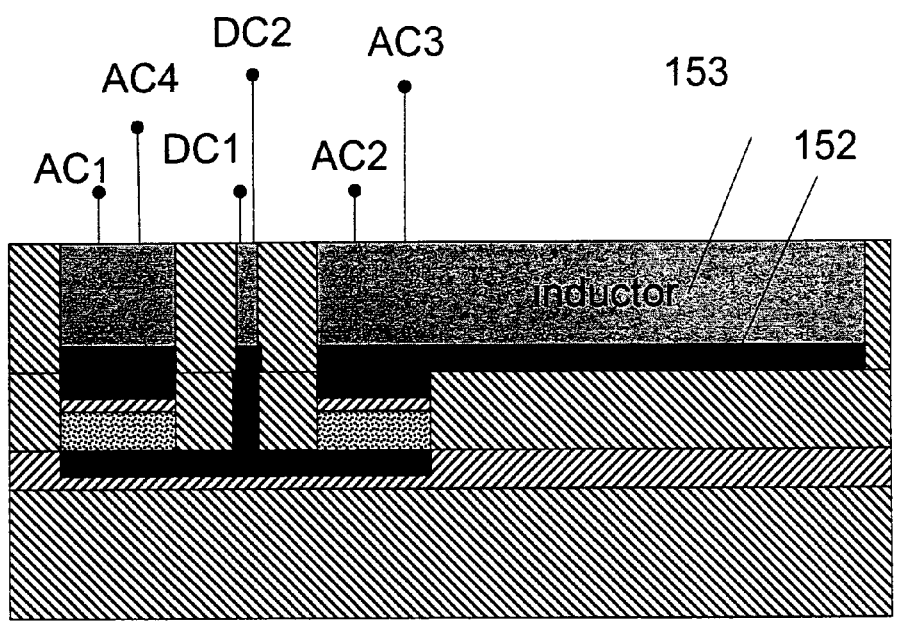
FIGS. 6a to 6c present a side view and top view as well as coupling schema of another preferred embodiment where the low-loss inductor structures and the ferroelectric capacitors are used to realize an integrated, tunable impedance matching circuit.
Figure 6B:
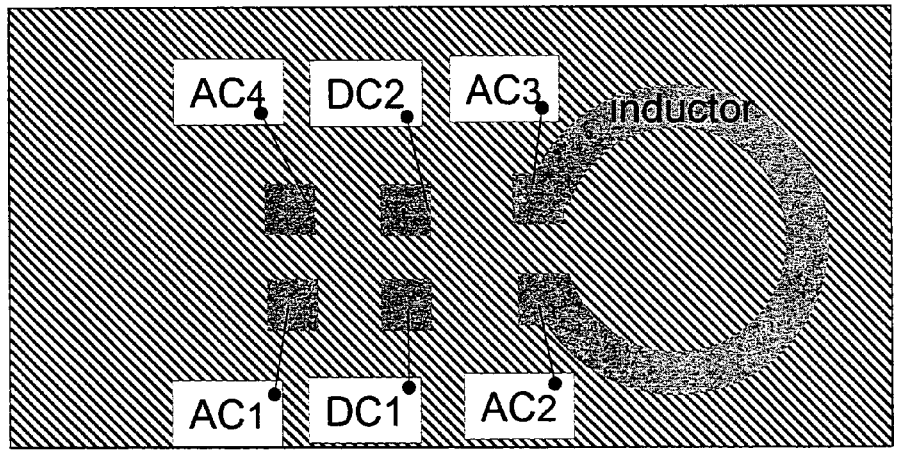
Figure 6C:
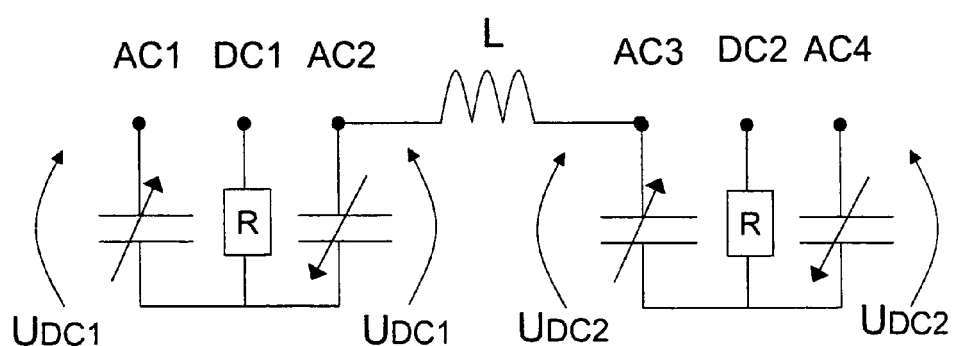

Another preferred embodiment based on integrated low-loss inductors and tunable, ferroelectric capacitors is shown in FIGS. 6a to 6c, in which a first capacitor structure (accessible via contacts AC1 and AC2, tuning voltage inserted via DC1), a low-loss inductor L, and a second capacitor structure (accessible via contacts AC3 and AC4, tuning voltage inserted via DC2) are connected. A tunable "pi-network", typically used as impedance matching network, can be realized e.g. by connecting contacts AC1 and AC4 to ground, using AC2 and AC3 as AC signal input and output, respectively, and using DC1 and DC2 as biasing voltage inputs to tune the first and the second capacitor structures. Of particular importance is again the capacitor structure in which the two capacitors are inversely biased resulting in low even-order nonlinearities, critical e.g. for harmonic distortion generation in wireless applications.

It is obvious to the person skilled in the art that the integrated structure described in FIGS. 4a to 6c may also include additional integrated components such as (i) several inductors or further capacitors, (ii) resistors (e.g. for biasing), (iii) non-tunable capacitors, etc. It is also obvious that the described structures are schematic and may not reflect the true dimensions or the true shape of the fabricated structures.

It is also obvious to the person skilled in the art that different embodiments of the invention are not limited to the examples described above, but that they may be varied within the scope of the enclosed claims. The process sequence is illustrated using BST as an example, but the method is applicable to any perovskite metal-oxide, or similar material, such as ZnO, AlN, $SiO_2$, $Si_3N_4$, CN, etc., that requires processing conditions destructive for the electrodes. It is also obvious that the capacitors may serve not only as lumped elements but also as part of distributed structures such as transmission lines. It is further obvious to the person skilled in the art that the present invention may be applied to the parallel plate structures that exhibit acoustic resonances which are transduced via piezoelectric or electrostrictive middle layer. Such structures can thus be operated as a FBAR (Thin Film Bulk Acoustic Resonator) or as a TFBAR (Tunable Thin Film Bulk Acoustic Resonator). Further, the structure may contain additional layers acting as acoustic mirrors.

The invention claimed is:

1. A fabrication method for parallel-plate structures, wherein the structures have a middle layer on a first substrate and disposed between top and bottom electrode layers, and wherein the middle layer and the top and bottom electrode layers are deposited on a second substrate, the method comprising:
growing the middle layer on the first substrate first; and
depositing the bottom electrode after growing the middle layer to form a layer stack;
transferring the layer stack to the second substrate;
removing the first substrate; and
depositing the top electrode on top of the middle layer.

2. The method according to claim 1, wherein processing conditions for optimal middle layer growth are destructive for optimal electrode materials.

3. The method according to claim 1, wherein the middle layer is a ceramic material selected from the group consisting of metal oxide, metal nitride, metal fluoride, featuring ferroelectric, paraelectric or piezoelectric properties and combinations thereof.

4. The method according to claim 1, wherein the middle layer is selected from the group consisting of a perovskite material a piezoelectric material, or combinations thereof.

5. The method according to claim 1, wherein the middle layer is a stack of layers comprising ceramic materials selected from the group consisting of metal oxide, metal nitride, metal fluoride, featuring ferroelectric, paraelectric or piezoelectric properties or a combination of those, and the middle layer is perovskite material or piezoelectric material.

6. The method according to claim 1, wherein the bottom and the top electrodes at least partially comprise electrically conductive material.

7. The method according to claim 1, wherein the bottom and the top electrodes are a metal selected from the group consisting of Cu, Al, Au, Ag, Pt, and combinations thereof.

8. The method according to claim 1, wherein adhesion layers and/or diffusion barriers are applied between the bottom and top electrodes and the middle layer.

9. The method according to claim 1, wherein at least one of the bottom and the top electrodes are patterned.

10. The method according to claim 1, further comprising depositing a buffer layer on the bottom electrode and processing the buffer layer in order to facilitate wafer bonding to a second bottom substrate.

11. The method according to claim 10, further comprising bonding the buffer layer with the second substrate, and after bonding, removing the first substrate.

12. The method according to claim 11, wherein removal of the first substrate is implemented by chemical-mechanical thinning followed by plasma etching.

13. The method according to claim 10, wherein the middle layer is patterned before bonding with the second bottom substrate.

14. The method according to claim 13, wherein the middle layer is pattered for ohmic contact creation to the bottom electrode from the top electrode.

15. The method according to claim 1, wherein the growing is accomplished using electrode position to obtain thick top metal conductors.

16. The method of claim 1, wherein the middle layer is the perovsite material $Ba_xSr_{1-x}TiO_3$.

17. The method of claim 1, wherein the middle layer is a piezoelectric selected from the group consisting of ZnO, AlN, and combinations thereof.

* * * * *